(12) United States Patent
Calvert

(10) Patent No.: US 8,262,971 B2
(45) Date of Patent: Sep. 11, 2012

(54) METHOD OF CENTRALIZING AND RETAINING MOLDED END COILS IN MAGNET FORMERS

(75) Inventor: Simon James Calvert, Witney (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 739 days.

(21) Appl. No.: 11/941,721

(22) Filed: Nov. 16, 2007

(65) Prior Publication Data

US 2008/0179784 A1 Jul. 31, 2008

(30) Foreign Application Priority Data

Dec. 6, 2006 (GB) .................................. 0624380.2

(51) Int. Cl.
| | |
|---|---|
| B27N 3/10 | (2006.01) |
| B29C 45/14 | (2006.01) |
| H02K 15/12 | (2006.01) |
| B28B 7/30 | (2006.01) |
| B28B 7/32 | (2006.01) |
| H01F 1/00 | (2006.01) |
| H01F 5/00 | (2006.01) |

(52) U.S. Cl. ............... 264/272.19; 264/257; 264/272.2; 264/275; 264/278; 264/313; 264/314; 335/216; 335/299

(58) Field of Classification Search ........................ None
See application file for complete search history.

(56) References Cited

U.S. PATENT DOCUMENTS

| | | | | |
|---|---|---|---|---|
| 3,365,417 | A | * | 1/1968 | Gavin et al. ...................... 525/11 |
| 3,445,113 | A | * | 5/1969 | Satchell et al. ................. 473/121 |
| 3,775,842 | A | * | 12/1973 | Sheldon et al. ................... 29/606 |
| 4,041,122 | A | * | 8/1977 | Quick et al. .................... 264/277 |
| 5,288,447 | A | * | 2/1994 | Day ................................ 264/112 |
| 5,657,972 | A | * | 8/1997 | Blatt ................................ 269/22 |
| 5,838,220 | A | * | 11/1998 | Hagberg ........................ 336/206 |

FOREIGN PATENT DOCUMENTS

| | | |
|---|---|---|
| GB | 2 299 673 A | 10/1996 |
| JP | 61-210602 A | 9/1986 |

OTHER PUBLICATIONS

Bob Paugh and Ken Sterry, Designing with inflatable seals, Machine Design, Mar. 9, 2006, A Penton Publication, 98-102.*

Great Britain Search Report dated Apr. 19, 2007 (three (3) pages).

* cited by examiner

*Primary Examiner* — Christina Johnson
*Assistant Examiner* — Benjamin Schiffman
(74) *Attorney, Agent, or Firm* — Crowell & Moring LLP

(57) ABSTRACT

A method for centralising and retaining a molded end coil (20) in a magnet former (12) which includes an oversleeve (24) for retaining the end coil in position, the radially outer (A2) surface of the end coil being of lesser diameter than the radially inner surface of the oversleeve. The method comprises the steps of: (a) centralising the end coil (20) on the former (12) by passing a spigot (28) through the bore of the end coil and into the end of the bore of the former to locate the end coil within the oversleeve and to leave a gap (30) between the radially outer surface of the end coil and the oversleeve; (b) retaining the end coil in position against an axially adjacent surface of the former by applying an axial force to the end coil in the direction of the former; (c) filling the gap with a hardening material (42) along at least part of its axial length; (d) causing or allowing the hardening material to harden, thereby to securely and accurately retain the end coil onto the former; and (e) removing the spigot.

21 Claims, 2 Drawing Sheets

METHOD OF CENTRALIZING AND RETAINING MOLDED END COILS IN MAGNET FORMERS

The present invention relates to the mounting of magnet coils. It particularly relates to the mounting of end coils for solenoidal magnets. In preferred embodiments, it relates to the mounting of end coils for superconducting magnets used in imaging systems such as nuclear magnetic resonance (NMR) or magnetic resonance imaging (MRI).

BACKGROUND OF THE INVENTION

It is conventional to manufacture solenoidal magnet coils, such as used in imaging systems such as nuclear magnetic resonance (NMR) or magnetic resonance imaging (MRI) by winding wire "in situ" into slots formed in a machined former. It is also known that a required field homogeneity may be more readily achieved by producing end coils of lesser diameter than the diameter of coils located towards the centre of the solenoidal arrangement.

Such arrangements have been achieved by having a former with slots of appropriate position and diameter to locate and retain such coils. However, particularly in the field of superconducting magnets for imaging systems such as nuclear magnetic resonance (NMR) or magnetic resonance imaging (MRI), it is required to reduce the overall length of the solenoidal magnet as far as is possible, to improve access to a human or animal patient, or other object to be imaged, and to reduce claustrophobia of the patient when placed in the imaging system, as well as to reduce the costs of other system components such as cryogen vessel and outer vacuum container, well known in the art. It is further required to reduce, as far as is possible, the length of wire used in winding of the coils. This is primarily due to the high cost of superconductive wire per unit length, but also serves to reduce the weight of the whole system, which in turn reduces the mechanical strength requirement for suspension components, which in turn may be used to reduce the size of the suspension components, reducing thermal influx to the magnet and its cooling system.

A known solution to these requirements involves the use of separately moulded end coils. In such an arrangement, a reduced-length inner former is used, and is not wound with end coils. The inner former is typically an aluminium tube with coils wound into slots formed on its outer surface. The coils are typically resin impregnated in situ. End coils are wound in a separate mould. The end coil thus wound is typically impregnated with a thermosetting resin which is allowed to cure. The moulded coils are then released from the mould to be attached to the end of the inner former as a separate article. Typically, end formers may be provided. These may be accurately-machined mechanical arrangement for supporting the end coils of the inner magnet and outer shield coils. They are attached to the inner former during assembly by any suitably accurate mechanical process, typically by bolting the former parts together. The end coils are typically retained onto the end former by clamp rings. The benefits of such an arrangement include the fact that material of the former is not provided on the inner surface or the end surface of the end coils. The absence of former material on the inner radial surface means that the inner diameter of the end coil may be reduced to the inner diameter of the inner former, reducing the length and so also the cost of superconducting wire required as compared to an arrangement where all coils are wound onto an outer surface of a solid former. The absence of former material on the axial end surface of the end coil means that the overall length of the solenoidal magnet may be reduced by the length dimensions of the former material conventionally provided beyond each axial end of the end coils.

FIG. 1 shows a quarter section of a known arrangement, having end coil 20 with an outer crust layer 2, for example, thermosetting resin impregnated with glass fibre or glass beads. This acts as a thermal diffusion barrier. The crust also provides a step feature 3. A structural web 4 is mechanically linked to the former. A thrust ring 5, typically of aluminium alloy, is welded 6 to the web 4. Thrust ring 5 includes an oversleeve which diametrically retains the end coil in position. End coil 20 is placed within the thrust ring. Balance shims 9 may be provided to adjust the axial position of the coil, and to compensate for asymmetries between the ends of the magnet. A coil clamp ring 7 bears against the step 3 in crust 2, retaining the coil in position against the thrust ring 5. Fasteners such as bolt 8 press the clamp ring into contact with the step 3. The axis of the solenoidal arrangement is parallel to the line A-A.

The known moulded end coils may suffer from quenches particularly in turns near the coil's inner radius. The field strength is particularly high at the inner radius, possibly double that present at the coil's outer radius.

Moulded coils are known to be relatively inaccurate. This may be caused by differential shrink of the impregnating material during curing. The use of moulded coils mounted onto a former leads to the probability of patchy contact between the coil and the former. In operation, the magnet coils are subjected to very high forces. The patchy contact may cause these forces to deform the coil or the former at points of high local stress. This yielding may cause a quench. The combination of high forces and patchy contact may also combine to cause some circumferential movement of the coil, which again may lead to a quench, or departure of the magnetic field characteristics from the optimal situation. It is accordingly conventional to use shims to ensure a precise tight and accurate fit of the moulded coil to its former.

Balance shims are known in conventional magnet arrangements for adjusting the axial position of outer coils. Typically, resin-impregnated moulded coils are used as end coils. Their axial position may be varied during assembly to improve the bare magnet homogeneity towards the designed specification. Shims of an electrically insulating, non-magnetic material such as Mylar® polyester sheet are placed between the end coil and the former. The number and thickness of the sheets are chosen to adjust the position of the coils to optimise the bare magnet homogeneity. The primary purpose of the axial shims is to correct for error introduced by the use of moulded coils.

Adjacent radial surfaces of the coil and its former may not be circular. The inner diameter of the moulded coil may not be concentric with its outer surface.

It is known to provide an aluminium former oversleeve gripping the coil tightly on its radially outer surface A2 in an attempt to improve quench training behaviour.

However, such arrangements have suffered from certain drawbacks, some of which will now be briefly described.

When the magnet assembly is cooled to operating temperature, which may be as low as 4K, the former, which is typically of aluminium or an aluminium alloy, shrinks in diameter onto the end coil, which is typically primarily of copper. This provides a tight grip of the former onto the end coil, intended to retain the coil securely in position. However, this tight grip may in fact be the source of quench events, if the end coil moves during operation—a so-called stick-slip event. The effect of stick-slip events on operation may be reduced by training: repeatedly ramping up and ramping down current in the magnet, so that the coils settle into a stable position.

The moulded end coils have to be wound separately from the rest of the solenoidal magnet, which increases machine set-up time and makes turns balancing more difficult. Turns balancing is the name given to a sequence of steps carried out during the assembly of a magnet, in order to compensate for any deviation of the manufactured magnet from the design, while still achieving approximately the designed magnetic field. The magnet must be assembled with high precision, and take into account the manufacturing tolerances of individual components. Typically, an aluminium former is machined with slots, into which a copper-based superconducting wire is wound.

In one turns balancing sequence, the following steps are performed. The formed dimensions of the slots and the actual cross-section of the wire may combine to mean that the desired number of turns per layer cannot be accommodated, or that a larger number of turns and/or axial shims, will be required to completely fill the axial length of the slot. It is important that each slot be completely filled along its axial length, since any scope for movement may lead to a quench of the magnet in operation. The dimensions of the slots formed in the former are accurately measured, and compared with an accurate measurement of the cross-section of the superconducting wire to be used. The coils are at least partially wound, and then measured for dimensions and number of turns. With these measurements known, a simulation of the finished magnet may be performed to provide a predicted homogeneity. It may be found necessary to vary the number of turns per layer from the design specification in order to completely fill the slot. In this context, attention must be paid to the cross-section of the wire, as this may not be constant along its length, and different numbers of turns may be placed on different layers. Turns can be added or subtracted to/from any of the coils in the magnet to return the predicted magnetic field to its designed bare-magnet homogeneity. It is preferred to add or subtract whole turns only, and it may be necessary to adjust the number of turns on more than one coil to achieve the designed bare-magnet homogeneity without resorting to partial turns. This adjustment of the number of turns on the coils of the magnet in order to achieve a designed magnetic field is known as turns balancing.

If a moulded end coil is used, it cannot take part in turns balancing, but other coils in the magnet need to be adjusted to compensate for any error in the moulded end coils.

Due to tolerance stack-up on the parts of the typical multi-part mould for the end coils, and non-uniform shrinkage of the resin impregnant during gelling, curing and cooling of the end coil, the external cylindrical surface of the finished end coil is typically neither perfectly round, nor concentric with the internal cylindrical surface of the windings of the end coil.

Since the dimensions and the finish of the end coil's surfaces cannot be accurately controlled, it is necessary to use a relatively expensive shimming process to achieve the required tight fit between the end coil and the former which retains the remaining coils of the magnet. This is a time-consuming process which is difficult to control. If the fit between the end coils and the former is not sufficiently good, this may lead to quench events. For example, known stick-slip movement of the coil, caused by weak frictional bonds breaking and the coil suddenly moving when in operation can lead to quenches, due to heat generated by friction during the movement of the coil. Similarly, patchy contact of the end coils to the former will produce high local contact stresses, and may deform either or both of the coil and the former. These effects may encourage quench events.

Such drawbacks accumulate such that the end coils are rarely concentric with the rest of the magnet coils, resulting in poor control of transverse homogeneity.

Furthermore, the multi-part mould typically used to form the end coils is coated with a release material which requires frequent re-applying, which adds to the production time and cost.

SUMMARY OF THE INVENTION

One object of the present invention, therefore, is to provide a new method for centralising and retaining moulded end coils in magnet formers, which retain most of the advantages of separately moulded end coils while at least partially addressing the disadvantages described above.

This and other objects and advantages are achieved by the method according to the invention a method for centralising and retaining a moulded end coil in a magnet former which includes an oversleeve for retaining the end coil in position, the radially outer surface of the end coil being of lesser diameter than the radially inner surface of the oversleeve. The method comprises the steps of: (a) centralising the end coil on the former by passing a spigot through the bore of the end coil and into the end of the bore of the former to locate the end coil within the oversleeve and to leave a gap between the radially outer surface of the end coil and the oversleeve; (b) retaining the end coil in position against an axially adjacent surface of the former by applying an axial force to the end coil in the direction of the former; (c) filling the gap with a hardening material along at least part of its axial length; (d) causing or allowing the hardening material to harden, thereby to securely and accurately retain the end coil onto the former; and (e) removing the spigot.

The above, and further, objects, characteristics and advantages of the present invention will now be described with reference to certain embodiments of the present invention, given by way of examples only, in conjunction with the appended drawings, wherein:

DETAILED DESCRIPTION OF THE INVENTION

Figure 1:
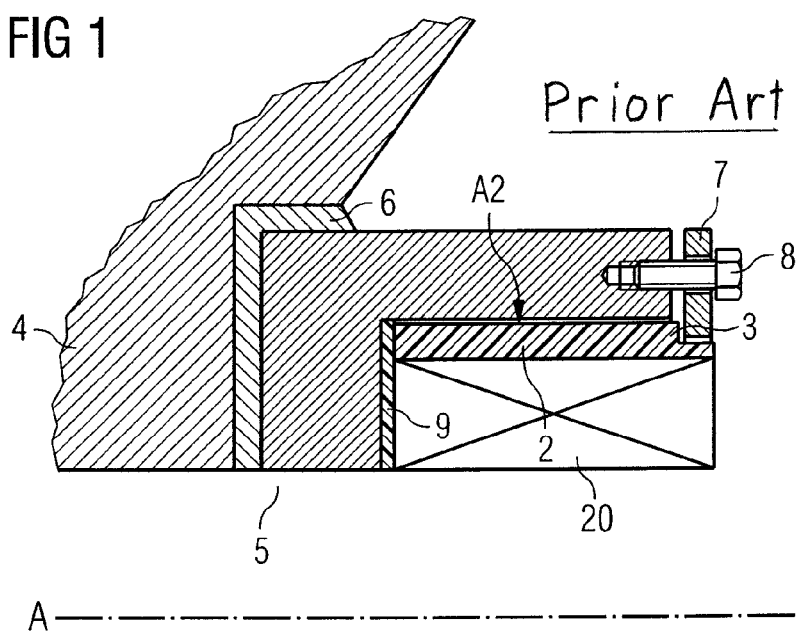
FIG. 1 shows a moulded end coil mounted to a former of a solenoidal magnet, according to the prior art.
Figure 2:
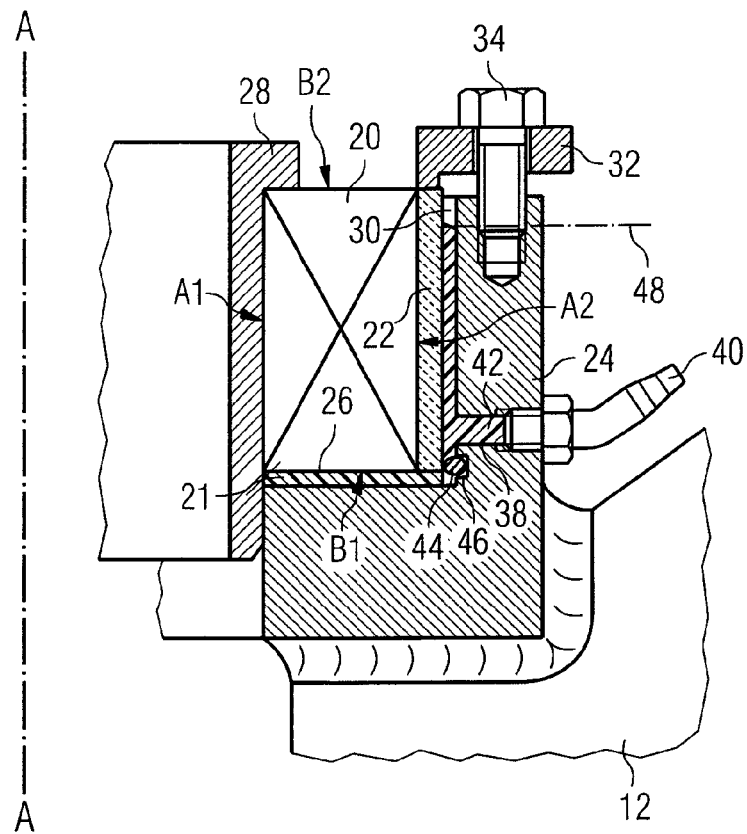
FIG. 2 shows a moulded end coil mounted to a former of a solenoidal magnet, according to an embodiment of the present invention.

As illustrated in FIG. 2, moulded end coils 20 are typically provided with an outer crust 22. Wire is wound into a mould, and crust layer is then applied over the outer surface of the wire. The wire is impregnated with a suitable material, typically a thermosetting resin. The material of the crust 22 also contains thermosetting resin or similar hardening material. Depending on the material chosen for the crust, impregnation of the wire and of the crust may take place at the same time. Common materials for the crust 22 include resin impregnated glass fibre cloth, or resin filled with glass beads. The crust layer contains no wire, but is provided for protection and mechanical fastening.

A problem with moulded end coils as used in the prior art is that the relationship between the coil crust outer diameter and the inner diameter of the windings is not known accurately. This makes it difficult to position the end coils such that their windings are concentric with the remainder of the magnet, since the end coils are retained on their radially outer surfaces, yet the position of the windings themselves is defined with reference to the radially inner surface of the coil. A known solution to this problem is to provide an excessively thick crust 22, and to machine the crust after hardening to be cylindrical, concentric with the windings, and of an accurate diameter which is matched to the coil former. The end coil may then be precisely located in the end former without shimming. However, this approach is time consuming, and poses a risk of machine damage to the coil windings and its wire leads. The present invention provides methods of concentrically mounting a separately moulded end coil onto a former without resorting to the machining of the end coils.

It is customary to refer to surfaces of rectangular solenoidal coils as follows. The radially inner and outer surfaces, and radii, are referred to as A1 and A2, respectively. The axially inner and outer surfaces, and positions, are referred to as B1 and B2, respectively. These labels are marked on the appropriate faces of end coil 20 in FIG. 2.

FIG. 2 shows an axial quarter-sectional view of an end coil 20 in the process of being mounted on a former 12 according to a method of the present invention. The axis of the solenoidal magnet is parallel to line AA. As discussed above, the former is not present on the radially inner (A1) and axially outer (B2) surfaces of the end coil 20. Former 12 includes an oversleeve 24 which retains the end coil in position. Typically, the former is of aluminium or aluminium alloy. The coil 20 is typically primarily of copper. When the magnet is cooled to operating temperature, the former shrinks more than the coil does, so that the oversleeve 24 clamps onto the outer radial surface (A2) of the end coil. Such oversleeve arrangement is conventional in itself. A layer 26 of low friction interface release material such as MYLAR® polyester sheet or polytetrafluoroethylene PTFE is preferably positioned between the axially inner (B1) surface of the end coil 20 and the adjacent surface of the former. This layer prevents adhesive bonding of the end coil to the former, so as to reduce or eliminate the chances of stick-slip events causing quench.

As illustrated in FIG. 2, moulded end coil 20 is provided with axial shims 21 for accurately positioning the end coil in a desired position for optimising the bare magnet homogeneity of the magnet. Such shims may be used to compensate for manufacturing tolerances, and to compensate for asymmetries in the magnet structure. The moulded end coil is radially centralised on former 12 by a spigot 28 which fits through the bore of the end coil into the end of the bore of former 12. Spigot 28 may be a central barrel of a mould into which end coil 20 was wound. Alternatively, spigot 28 may be separate from the mould, being provided for this function.

According to an aspect of the present invention, the axially outer (A2) surface of the end coil 20, that is to say the surface of the crust 22, is of lesser diameter than the inner surface of the oversleeve 24. There is, therefore, a gap 30 between the crust 22 and the oversleeve 24. According to an aspect of the present invention, this gap ensures that the crust 22 need not have a perfectly cylindrical surface, nor need the crust's surface be perfectly concentric with the winding, for the end coil to fit into the oversleeve 24. The radial dimension of gap 30 will vary across the axial length of the end coil, and around its circumference.

Of course, the gap 30 will need to be filled to ensure that the end coil 20 is securely and accurately retained onto the former 12.

As shown in FIG. 2, the windings of end coil 20 are held precisely concentric with the former 12 by the spigot 28. A temporary axial clamp 32 is provided to apply an axial force to the end coil in the direction of the former, and so to axially retain the end coil firmly against the layer 26 of low friction interface release material and the former 12. Axial clamp 32 is held against the end coil by retaining means such as bolts 34, which are tightened to apply clamping force to the end coil 20. The axial clamp preferably bears against the material of the crust 22 rather than the windings of the coil 20 themselves, to reduce the likelihood of causing damage to the windings. The end coil is accordingly held accurately in its design position: held concentric to the former 12 by spigot 28, and held axially against the former by clamp 32.

According to an aspect of the present invention, the coil is retained in this ideal position by the admission, in viscous liquid or semi-liquid form, of a hardening material into the gap 30 along at least part of its axial length. For this purpose, a number of apertures 38 are provided through the material of the former oversleeve, at appropriate intervals around the circumference of the oversleeve. This provides access to the gap 30. An admission nipple 40, of conventional construction, is affixed into each aperture 38, for example by screwing a threaded nipple into a threaded aperture 38. A hardening material 2, preferably a viscous liquid or semi-liquid but could be a free-flowing liquid, is then admitted through a pipe (not shown) attached to the nipple 40 into the gap 30. This may be achieved by any suitable method, such as using a peristaltic pump, under gravity, under vacuum, use of a pressure vessel or by use of a syringe. A suitable seal, such as an o-ring 44 in a cavity 46 in the oversleeve 24, may be provided to preventingress of the hardening material 42 between the axially inner (B1) face of the coil and the adjacent surface of the former or the layer 26 of low friction interface release material. Alternatively, the axial force applied to the end coil in the direction of the former by the temporary axial clamp 32 may be sufficient to prevent such ingress. The hardening material 42 is selected for its thermal and mechanical properties at the temperature of operation. A suitable material has been found to be an epoxy resin such as those sold under the STYCAST® brand by Emerson & Cuming Speciality Polymers. A suitable quantity of hardening material 42 (which quantity may be found by trial and error, calculation, or operator observation during introduction) is introduced into the gap 30 to fill the gap to a certain flood level 48. The flood level is determined as providing sufficient hardening material to fill gap 30 along at least part of its axial length, without significant risk of the hardening material leaking out of the axially outer end of the gap.

In a preferred arrangement of the method of the present invention, the magnet and its coils are arranged with the axis (parallel to A-A) vertically, as shown in FIG. 2, during the introduction and hardening of the hardening material. This is to take advantage of gravity in retaining the hardening material within the gap until it has hardened. In such an arrangement, hardening material is of course only introduced into the gap at the upper end, which is allowed to harden before the whole structure is inverted and hardening material introduced into the gap at the other end, and allowed to harden.

In other arrangements, the viscosity of the hardening material may be sufficient to prevent it from leaking out of the gap before hardening. In such arrangements, the axis (parallel to A-A) may remain horizontal throughout the procedure, and hardening material may be introduced into the gaps at both ends simultaneously.

Once the gap 30 is filled to the required level, introduction of the hardening material 42 ceases and the pipes are clamped, or otherwise sealed and the hardening material is allowed to harden, by passage of time, cooling, heating or other treatment appropriate to the hardening material used.

Once the hardening material 42 has fully hardened, the end coil 20 is firmly and accurately retained, concentric to the former 12 and in the required axial position by the, now solid, hardening material. The nipples 40, spigot 28 and temporary axial clamp 32 may all be removed.

The end coil is retained in position, both radially and axially, by the hardening material. The hardening material is fully compliant to any irregularities in the outer surface of the crust 22 of the end coil, and retains the end coil by adhesive bond to the inner radial surface of the oversleeve 24. The end coil is radially retained by the oversleeve 24 and the hardening material 42, and is retained axially by the adhesive bond provided by the hardening material 42, between the crust 22 of the end coil 20 and the radially inner surface of the oversleeve 24.

In some embodiments, the presence of a crust layer 22 is unnecessary. The temporary radial clamp 32 may be applied to the coil 20, and the hardening material 42 is then used to fill a gap between the coil and a suitably dimensioned oversleeve 24.

Figure 3A:
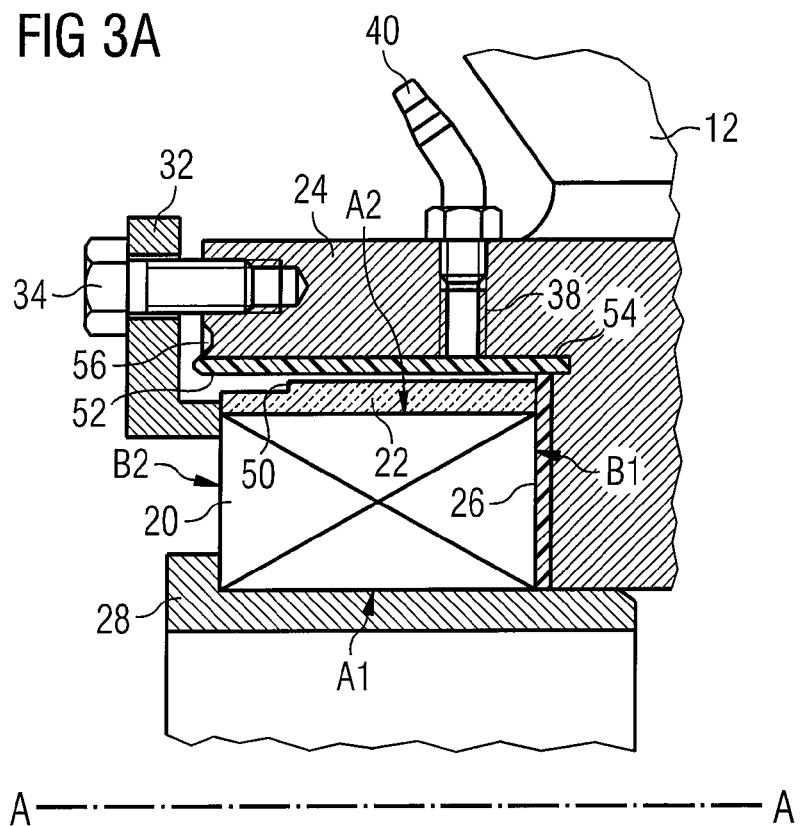
FIGS. 3A-3B show a moulded end coil mounted to a former of a solenoidal magnet, according to another embodiment of the present invention.
Figure 3B:
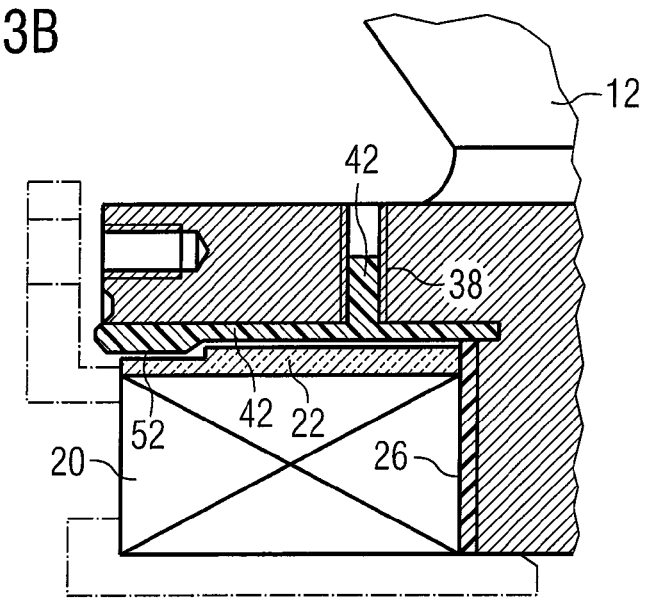

FIGS. 3A and 3B illustrate a method of centralising and retaining moulded end coils in a magnet former according to another embodiment of the present invention.

The embodiment illustrated in FIG. 3A-3B shares many features with the embodiment of FIG. 2, and corresponding features carry corresponding reference numerals. Since much of the procedure is as explained with reference to FIG. 2, only the differences between the method of FIG. 2 and the method of FIGS. 3A-3B will be explained here.

As can be seen in FIG. 3A, the crust 22 is preferably provided with a recessed step feature 50 near its axially outer end. The purpose of this step feature will become apparent from the following description, and this step feature may be included in crusts of end coils centralised and retained by the method discussed with reference to FIG. 2.

According to this embodiment of the invention, the coil crust 22 is not bonded to the former oversleeve 24 but rather is gripped by pressure applied by a distendable bladder 52 filled with hardening material, under pressure.

While the hardening material of FIG. 2 is preferably viscous or semi-liquid, hardening material of FIGS. 3A-3B need not be viscous, and may easily be a free-flowing liquid, since it is retained within bladder 52.

The bladder 52 may be composed of a thin aluminium strip, extending around the inner radial surface of the oversleeve 24 along at least part of the axial length of the gap 30, secured at axially inner and outer edges so as to produce an annular distendable cavity accessible through nipples 40 and apertures 38. The aluminium strip may be affixed at its axially inner edge by insertion into a channel 54 provided for the purpose in the material of the former 12. The strip may be retained in the channel 54 by suitable means such as welding, adhesive bonding or mechanical clamping. The aluminium strip may be affixed at its axially outer edge by insertion into a channel 56 provided for the purpose in the axially outer end of the oversleeve 24 of the former 12. In alternative embodiments, the bladder does not extend the full axial length of the gap 30. In such embodiments, channels may be formed in the inner radial surface of the oversleeve, to retain inner and outer edges of the strip. The strip may be retained in the channel 56 by suitable means such as welding, adhesive bonding or mechanical clamping.

As illustrated in FIG. 3B, a liquid or semi-liquid hardening material 42 is then pumped through a pipe (not shown) attached to the nipple 40 into the bladder 52 to fill the bladder 52 to a certain predetermined pressure. This pressure may be relatively small, and may be achieved by any suitable method, such as under gravity, under vacuum, use of a pressure vessel or by use of a syringe. The hardening material 42 is selected for its thermal and mechanical properties at the temperature of operation. An epoxy resin such as those sold under the STYCAST® brand by Emerson & Cuming Speciality Polymers has been found be a suitable material. The predetermined pressure is determined as providing sufficient hardening material to distend the bladder 52 sufficiently to conform to the surface of the crust 22 of the end coil, including at least approximate conformity to the step feature 50. It is considered unnecessary to distend the bladder to such a pressure that it completely fills a right angled internal angle of the step feature.

In FIG. 3B, the end coil 20 and its crust 22 are shown displaced slightly away from the distended bladder, for clarity of illustration, by under-representing the radial dimension of the coil 20. In reality, the distended bladder 52 will bear with some force, largely determined by the predetermined pressure, onto the crust 22.

Once the bladder 52 is filled to the required pressure, pumping of the hardening material ceases and the pipes are clamped, or otherwise sealed and the hardening material is allowed to harden within the bladder 52, while still under pressure.

Once the hardening material 42 has fully hardened, the end coil 20 is firmly and accurately retained, concentric to the former 12 and in the required axial position by the, now solid, bladder filled with hardening material. In the described embodiment, the bladder consists of a distendable aluminium strip and the inner radial surface of the oversleeve 24. In such an embodiment, the hardening material forms an adhesive bond to the oversleeve 20, and the bladder retains the end coil by pressure and conformity to irregularities in the surface of the crust 22, including the step feature 50. The nipples 40, spigot 28 and temporary axial clamp 32 may all be removed. The end coil is retained in position, both radially and axially, by the bladder. The end coil 20 is radially retained by the oversleeve and the hardening material, and is retained axially by the shape of the distended, solid, bladder which is at least approximately compliant to any irregularities in the outer surface of the crust 22 of the end coil, including the step feature 50, and the adhesive bond of the hardening material to the inner radial surface of the oversleeve 24.

The step feature 50 may be provided by machining the outer surface of the crust 20. However, as discussed in relation to the prior art, it is preferred to avoid machining of the end coil assembly. Alternatively, the crust may be formed by winding cloth layers over the coil, and the final layers may be wound axially narrower than the end coil itself, to provide the required step feature. Step features formed in this manner may not have a right angled step, but it may be curved or obtuse angled. Such step shapes may be more suitable to bladder conformity.

In some embodiments, the presence of a crust layer 22 is unnecessary. The clamp may be applied to the coil 20, and distended bladder 52 bears upon the radially outer (A2) surface of the end coil 20. The oversleeve 24 will be suitably dimensioned. In such embodiments, the step feature 50 will not be present. In intermediate embodiments, a crust 22 is provided only over part of the axial dimension of the end coil, to produce a step feature.

The use of the distendable bladder allows a certain amount of compressive preload force to be applied to the outer surface of the end coil, by increasing the pressure of the hardening material within the bladder during hardening.

While the present invention has been described with reference to a limited number of specific embodiments, numerous modifications and variations will be apparent to those skilled in the art. For example, the hardening material may be an epoxy resin, other thermosetting materials, thermoplastic materials such as paraffin wax, polymers or materials such as water or nitrogen. Suitable materials must be selected according to the required operating temperature. Superconducting magnets are operated at temperatures as low as 4K, at which temperature the physical and mechanical properties may be much different from their properties at room temperature.

The bladder employed in certain embodiments of the present invention may take forms other than that described. Rather than a simple strip bonded to the former, the bladder may be formed as a separate unit, akin to a tyre inner tube, and provided with at least one material admission port for admitting the hardening material into the bladder. Similarly, while the bladder has been described as being formed of aluminium, bladders formed of other ductile materials, such as copper, or other metals may be used.

Alternative means of introducing the hardening material into the gap or the bladder may be employed. For example, an aerosol expanding foam material similar to that used in the construction industry, but of increased strength, may be squirted into a gap between oversleeve and coil.

Alternative means of retaining the end coil in position while the hardening material is admitted and is hardening may be employed. For example, an end clamp may be attached to, or form part of, spigot 28. Rather than being mechanically retained against the former, two end clamps may be provided, one at each end of the former, and mechanically braced against each other, or against respective spigots 28 which are provided, one at each end of the former, and mechanically braced against each other. Other means of retaining the end coil against the adjacent surface of the former may be employed, as will be apparent to those skilled in the art.

The methods provided by the present invention provide at least the following advantages.

The crust 22, or outer radial surface, of coil 20 is in uniform contact with the oversleeve 24. This avoids the patchy contact which was a feature of prior art arrangements, and reduces any tendency for the coil to move in operation.

This is believed to result in a reduced tendency to quench, and may reduce the number of ramping up and ramping down cycles required to train the magnet before it is shipped to a customer.

The conventional requirement for permanent axial clamping components for retaining end coils is eliminated, leading to a reduction in cost. The method of the present invention may be applied to existing coil and former designs with minor modification, for example the inner diameter of the oversleeve may need to be increased somewhat to accommodate an irregular crust surface and the hardening material, with or without a bladder.

While the spigot as illustrated was a cylindrical member, the spigot need not have a continuous surface. It may simply comprise a plurality of rods or pegs, appropriately positioned, of sufficient length to pass through the bore of the end coil into the bore of the former, and to retain the end coil securely in position both radially and axially.

Due to the increased precision in locating the end coils, both concentrically with the former, and in its axial position, the transverse bare magnet homogeneity will be improved. Furthermore, the conventionally required outer radial (A2) shimming operations which positioned each end coil within its oversleeve are eliminated and replaced by more controlled processes.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method for centering and retaining a molded end coil in a magnet former which includes a circumferentially extending oversleeve for retaining the end coil in position, a radially outer surface of the end coil being of lesser diameter than a radially inner surface of the oversleeve, said method comprising the steps of:
   (a) centering the end coil on the former by passing a spigot through a bore of the end coil and into an end of a bore of the magnet former to locate the molded end coil within the oversleeve, leaving a gap between the radially outer surface of the end coil and the radially inner surface of the oversleeve;
   (b) retaining the end coil in position against an axially adjacent surface of the former by applying an axial force to the end coil in the direction of the former;
   (c) filling the gap with a hardening material along at least part of its axial length;
   (d) causing or allowing the hardening material to harden, thereby to securely and accurately retain the end coil onto the former; and
   (e) removing the spigot.

2. A method according to claim 1, wherein the axial force of step (b) is applied by a temporary axial clamp held against the end coil by retaining means which are tightened to apply the axial force to the end coil.

3. A method according to claim 1, wherein a plurality of apertures are provided through the material of the former oversleeve, at appropriate intervals around the circumference of the oversleeve, to enable the admission, in viscous liquid or semi-liquid form, of hardening material into the gap.

4. A method according to claim 1, wherein a suitable quantity of hardening material is introduced into the gap to fill the gap to a certain flood level, the flood level being determined as providing sufficient hardening material to substantially fill the gap, without significant risk of the hardening material leaking out of the axially outer end of the gap.

5. A method according to claim 1, wherein ingress of the hardening material between an axially inner face of the end coil and an axially adjacent surface of the former is prevented by a seal.

6. A method according to claim 1, wherein the hardening material is fully conformal to the outer surface of the end coil, and retains the end coil by an adhesive bond to the inner radial surface of the oversleeve.

7. A method according to claim 1, wherein, prior to step (c), a distendable bladder is provided in the gap, and step (c) consists of introducing the hardening material in liquid or semi-liquid form into the distendable bladder so as to cause the bladder to distend into at least substantial conformity to the radially outer surface of the end coil.

8. A method according to claim 7, wherein the hardening material is introduced into the bladder to fill the bladder to a certain predetermined pressure.

9. A method according to claim 7, wherein the bladder is composed of a strip of deformable material, extending around the inner radial surface of the oversleeve, secured at axially inner and outer edges of the strip of deformable material, and an aperture is provided through the material of the former oversleeve, so as to produce an annular distendable cavity accessible through the aperture.

10. A method according to claim 9, wherein the strip of deformable material is affixed at its axially inner edge by insertion into a channel in the material of the former, and is affixed at its axially outer edge by insertion into a channel in the axially outer end of the oversleeve.

11. A method of claim 9, wherein the deformable material comprises one of the following materials: aluminum, copper, a polymer, glass fiber felt.

12. A method according to claim 7, wherein the hardening material forms an adhesive bond to the oversleeve and the bladder retains the end coil by pressure and conformity to irregularities in the surface of the end coil.

13. A method according to claim 1, wherein the end coil comprises a crust layer on its outer radial (A2) surface, and wherein the hardening material is introduced between an outer radial surface of the crust layer and an inner radial surface of the oversleeve.

14. A method according to claim 13, wherein the axial force is applied to an axially outer surface of the crust layer.

15. A method according to claim 13, wherein the crust layer is provided with a recessed step feature.

16. A method according to claim 15, wherein the crust is provided only over part of an axial dimension of the end coil, to produce the step feature.

17. A method according to claim 15, wherein the recessed step feature is provided near an axially outer end of the crust layer.

18. A method according to claim 15, wherein the recessed step feature is provided by winding cloth layers over the end coil to form the crust layer, and final cloth layers are wound axially narrower than the end coil itself, to provide the required step feature.

19. A method according to claim 1, further comprising the step of placing a layer of low friction interface release material between an axially inner surface of the end coil and the axially adjacent surface of the former.

20. A method according to claim 19, wherein the low friction interface release material comprises polyester sheet or polytetrafluoroethylene.

21. A method according to claim 1, wherein the hardening material comprises one of the following materials: an epoxy resin, other thermosetting materials, a thermoplastic materials, paraffin wax, polymer, water and nitrogen.

* * * * *